US005789995A

United States Patent [19]
Minasi

[11] Patent Number: 5,789,995
[45] Date of Patent: Aug. 4, 1998

[54] LOW LOSS ELECTRONIC RADIO FREQUENCY SWITCH

[75] Inventor: David H. Minasi, Plantation, Fla.

[73] Assignee: Motorola, Inc., Schaumburg, Ill.

[21] Appl. No.: 717,025

[22] Filed: Sep. 20, 1996

[51] Int. Cl.$^6$ .................... H01P 1/15; H04B 1/44; H03H 11/34
[52] U.S. Cl. ............... 333/103; 333/262; 455/83
[58] Field of Search ............... 333/101, 103, 333/104, 262; 455/78, 83

[56] References Cited

U.S. PATENT DOCUMENTS

| | | | |
|---|---|---|---|
| 3,452,299 | 6/1969 | Angel | 333/103 |
| 4,677,688 | 6/1987 | Yoshihara et al. | 455/83 X |
| 4,803,447 | 2/1989 | Schultz et al. | 333/262 X |
| 4,853,972 | 8/1989 | Ueda et al. | 455/78 X |
| 5,054,114 | 10/1991 | Erickson | 333/101 X |
| 5,166,857 | 11/1992 | Avanic et al. | 455/78 X |
| 5,513,382 | 4/1996 | Agahi-Kesheh et al. | 333/246 X |

Primary Examiner—Robert J. Pascal
Assistant Examiner—Barbara Summons
Attorney, Agent, or Firm—Frank M. Scutch, III

[57] ABSTRACT

A low loss electronic radio frequency (RF) switch (100) for switching RF energy between an antenna port (115), a receiver port (113) and a transmit port (101) used in a two-way radio transceiver. The RF switch includes a first diode (105) connected between the transmit port (101) and the antenna port (115). A first capacitor (103) is connected between the transmit port (101) and a ground potential while an inductor (107) and second capacitor (111) are serially connected between the antenna port (115) and a receive port (113). A second diode (109) is connected between the inductor (107) and the second capacitor (111) and the ground potential. The antenna port (115) is normally connected with the receive port (113) when idle. When direct current is applied to the transmit port (101) the first diode (105) and second diode (109) are biased into a low impedance state connecting the antenna port (115) to the transmit port (101) and isolating the receive port (113) from the antenna port (115).

8 Claims, 3 Drawing Sheets

100 ately, it also has several significant disadvantages:

LOW LOSS ELECTRONIC RADIO FREQUENCY SWITCH

TECHNICAL FIELD

This invention relates in general to radio frequency (RF) switching and more particularly to RF switching in a two-way radio transceiver.

BACKGROUND

One of the more important applications of an RF switch in a radio transceiver is the Transmit-Receive Antenna (TR) Switch. Such a circuit is shown in prior art FIG. 1 that depicts a TR switch in its most common form. As will be evident to those skilled in the art, this is a reactively isolated switch which consists of three main elements viz. series switch using diode CR1, shunt switch using diode CR2, and reactive isolation network comprised of capacitor C1, capacitor C2, and inductor L1. All three ports are assumed to be matched to a system characteristic impedance that is nominally 50 ohms. Capacitors C1 and C2 are set to Xc=−jR while inductor L1 is set to XL=+jR, where resistance R is set to the characteristic impedance.

This network is also known as a lumped element quarter wave section. As the name implies, when one end of the network is shorted to ground, a high impedance is seen at the opposite end of the network and when one end is terminated with the system characteristic impedance that same impedance is seen looking in the other end, much like a one quarter wavelength section of transmission line. At higher operating frequencies a quarter wave transmission line is often used in place of the lumped network in this application. This is more commonly referred to as a quarter wave isolated switch.

The switch operates in the following manner. When the receive path is selected, either no DC bias or a reverse DC bias is applied to the P-Intrinsic-N (PIN) diodes CR1, CR2 and they present a high impedance at the RF operating frequency. Diode CR1 isolates the transmitter port from the antenna while the network (or ¼ wave line) connects the Receive port RX to the antenna port ANT. Diode CR2 is in its high impedance state so it has little or no effect on the signal as it passes from the antenna to receive port RX. When transmitting, direct current (DC) bias is applied from the TX port to diode CR1 and flows to ground through inductor L1 and diode CR2. Both PIN diodes CR1 and CR2 are forward biased and as such, in their low impedance state. The transmit port TX is connected to the antenna port ANT via diode CR1. Diode CR2 acts to short the receive port RX to ground thus isolating it. The network or ¼ wave line will then isolate the signal on the transmit/antenna port from the short at the receive port RX that results from the forward biased condition of diode CR2.

This topology has several distinct advantages:

1) If diodes are used as the switch devices, as is most commonly the case, the circuit draws no current in the receive mode.

2) In the transmit mode the current to forward bias the diodes CR1 and CR2 is shared in the two devices.

3) Semiconductor switching devices, whether PIN diodes or field effect transistors (FET's), share a common characteristic in that they are able to handle much larger power in the ON or conducting state then in the OFF or isolated state. In that the power handling requirement of the switch in the transmit state is generally several orders or magnitude greater than that in the receive state, it is advantageous to use a topology wherein both diodes CR1 and CR2 are ON in the transmit state.

The principle disadvantages of this topology are the bandwidth limitation i.e. quarter wave section is only a quarter wave at a single frequency and "Q" or resistive loss in the quarter wave section (whether lumped or distributed.) The problem with resistive loss can be overcome with more expensive or larger hi-Q elements. The bandwidth limitation is inherent in the topology regardless of whether a lumped or distributed implementation is chosen. For best performance, the percent bandwidth of operation for this topology should be limited to about 10%. Wider bandwidth operation is possible where degraded VSWR and insertion loss at the band edges is acceptable.

FIG. 2 shows a second prior art switch topology that is capable of very wide bandwidth operation. This switch operates in the following manner. When bias is applied to BIAS 1 the diode CR1 is forward biased into a low impedance state connecting port 1 to the COM port. If BIAS 2 is unbiased or reverse biased at the same time then port 2 will be isolated from the COM port. However, if bias is removed from BIAS 1 and applied to BIAS 2, then port 2 will then be connected to COM and port 1 isolated. The inductors and capacitors in the circuit serve only as DC supply chokes and DC blocking. The loss in this type of switch is mainly a function of the internal resistance of the PIN diodes when forward biased. The bandwidth of this type of switch is limited only by the DC bias supply chokes and DC blocking capacitors. Broad bandwidth and low insertion loss operation are distinct advantages of this switch topology. Unfortun 1) When used in a TR switch application, the switching device (PIN diode or FET) that connects the receiver port to the antenna is exposed to the relatively high RF voltage of the transmitter output signal. This places stringent requirements on the switching device in terms of voltage breakdown and carrier transit time. Such a device will be significantly more complex to implement than its counterpart in the more conventional circuit in FIG. 1. Assuming the device is chosen to survive the incident transmitter voltage, the designer would also contend with harmonic regeneration in the switch device. This is generally dealt with through additional harmonic filtering and/or high voltage reverse biasing of the OFF state PIN diode. While practical, these measures do add path loss and/or undesirable cost and complexity.

2) If PIN diodes are used for the switching function this topology will have a non-zero operating current in receive mode. Diodes with parameters necessary to satisfy the requirements as indicated above for a 5 watt transmitter will require 5 to 10 milliamps (mA) forward current to reach an equivalent series resistance Rs low enough to allow low insertion loss.

The problem raised above can be solved via the "current stacking" scheme shown in prior art FIG. 3. In this circuit, the receive mode bias current for the antenna switch diode is easily obtained by interrupting the current supply to the receiver front end and passing it through the PIN diode. Aside from the fact that it requires a somewhat complex bias switching arrangement that includes a separate regulator for the receiver front end, this circuit is practical and works well in systems with a supply of approximately 7.2 volts when the receiver runs off of regulated 5 volts.

Thus, the need exists to provide an RF switch that can provide wide bandwidth, isolation with low signal loss with few electrical components.

DETAILED DESCRIPTION OF THE PREFERRED EMBODIMENT

Figure 4:
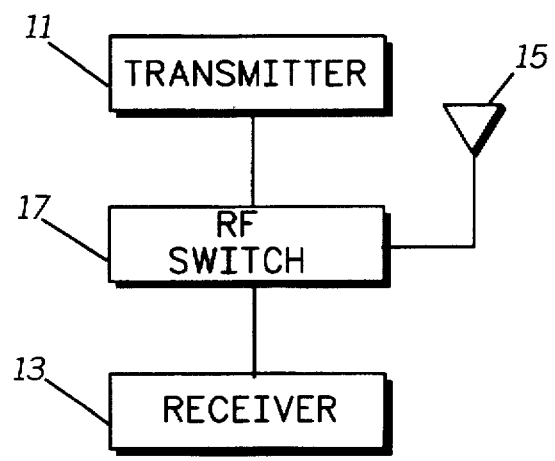
FIG. 4 is a block diagram of the radio frequency switch in accordance with the present invention.

Referring now to FIG. 4, a block diagram of the radio frequency (RF) switch system 10 includes the transmitter 11 and a receiver 13. Both of these components are typically used in a two-way radio transceiver and are switched to an antenna 15 by the RF switch 17 which acts to isolate the receiver 13 when the radio is in a transmit mode.

Figure 5:
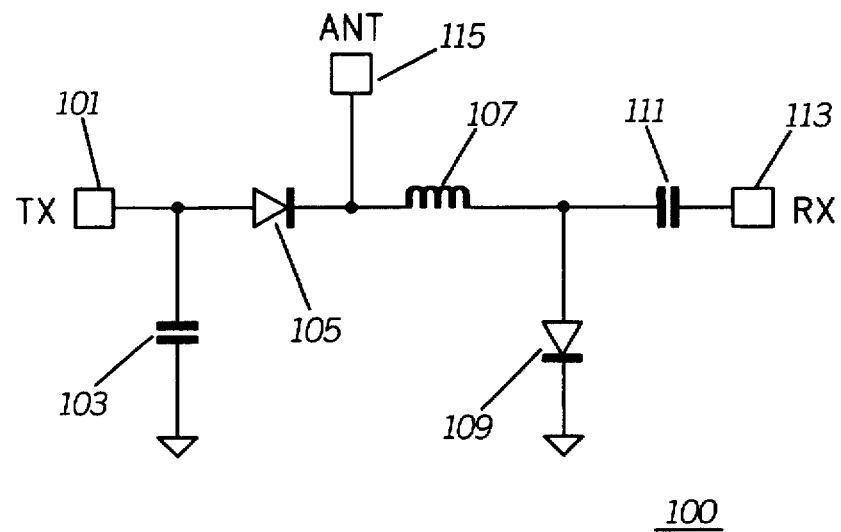
FIG. 5 is a circuit diagram the low loss electronic radio frequency switch in accordance with the present invention.

In FIG. 5, the operation of a low loss electronic radio frequency switch 100 is shown in accordance with the preferred embodiment of the present invention. As recognized to those skilled in the art, the impedance of the RF switch 100 is a function of the reactance values of the various network elements. These elements include capacitor 103, inductor 107, and capacitor 111. The following description assumes initially that the reactance (X) value these three elements is substantially equal and set to 50 ohms at the center frequency of the operating range. When the switch is set to receive, where the diode 105 and diode 109 are unbiased or "open", the receive port 113 and antenna port 115 are connected with inductor 107 and capacitor 103 which form a series resonant "short" between the two ports. The capacitor 103 is isolated from the active path by the diode 105. As will be evident to those skilled in the art, diodes 105 and diode 109 are typically P-Intrinsic-N (PIN) diodes.

When the diodes 105 and 109 are forward biased in the transmit state, the antenna port 115 is connected to the transmit port 101 by diode 105. The node connecting diode 109, inductor 107 and capacitor 111 is grounded by diode 109 isolating the receiver port 113. With the diodes 105 and 109 in an ON state, capacitor 103 and inductor 107 are parallel connected and cancel each other's reactance assuming that appropriate network element values are maintained. Further, if it is assumed that a reactance of 50 ohms for the combination of capacitor 103, inductor 107 and capacitor 111, the transmit path will have characteristics very much like the ¼ wave isolated switch. In the receive mode, aside from the path topology changes from low pass to band pass, the performance will be substantially that of a lumped ¼ wave design. However, when the reactive elements are manipulated to values other than the system characteristic impedance, several important characteristics become apparent.

(1) The transmit path operating bandwidth will increase in proportion with reactance value of capacitor 103 and inductor 107.

(2) The center frequency of the transmit passband and receive passbands may be set independent of one another.

(3) The receive path characteristic is that of a series resonant bandpass pole formed by inductor 107 and capacitor 111, such that the network can be increased in bandwidth through the addition of a second series resonant network and coupling element.

(4) The receive path characteristic is that of a series resonant bandpass pole formed by inductor 107 and capacitor 111 and as such may be tuned via a single element.

(5) The capacitor 111 is isolated from the high power transmit signal by diode 109 and as such its linearity and breakdown voltage requirements are on a par with whatever other devices are present in the receiver front end i.e. substituting a voltage tunable capacitor is practical.

Thus, in virtually all portable two-way radio transceivers the antenna switch 100 will be followed in the receiver chain by a band pass filter. In very wide band designs this is often a varactor tuned filter. This combined with the advantages listed above suggest a cost effective solution for wide and moderate bandwidth applications.

Figure 1:
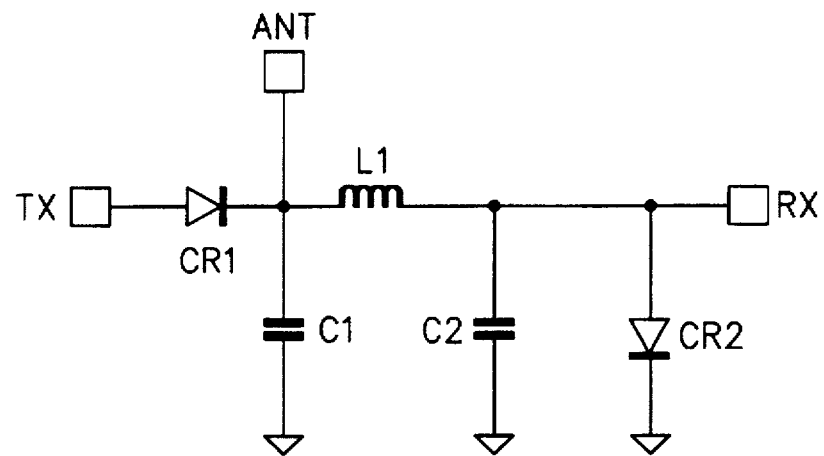
FIG. 1 is a prior art circuit diagram of a quarter wave isolated radio frequency switch.
Figure 2:
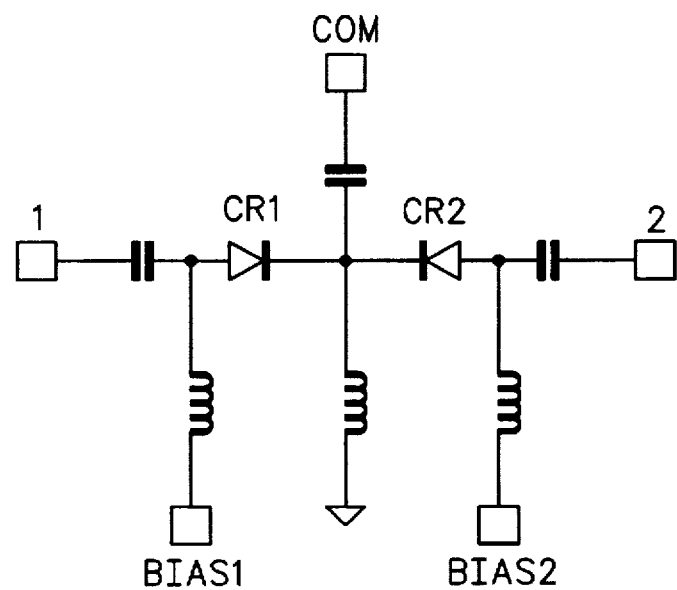
FIG. 2 is a prior art circuit diagram of a wide bandwidth radio frequency switch.
Figure 3:
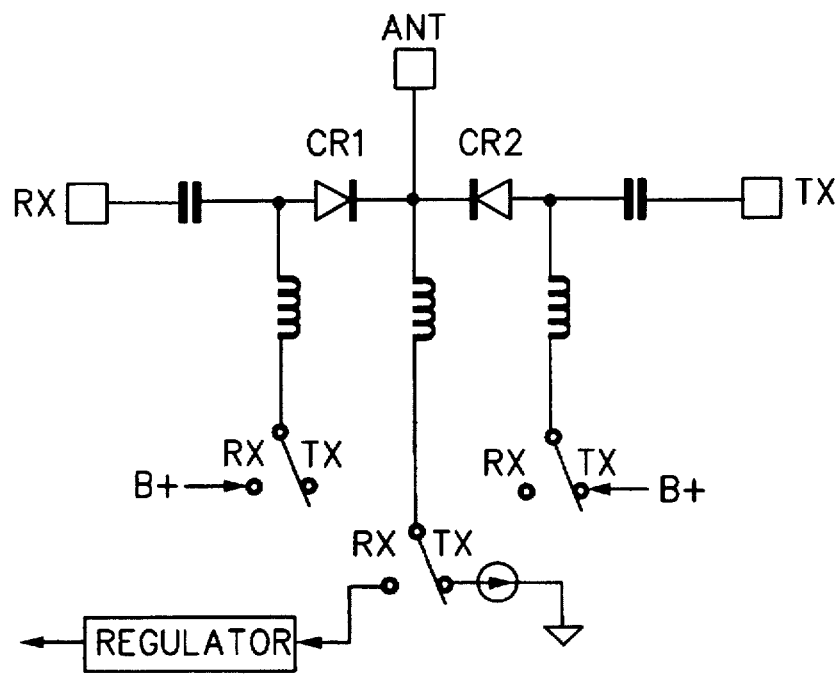
FIG. 3 is a prior art circuit diagram showing a radio frequency switch that uses a current stacking technique.

An additional advantage relates to the inductor in the isolation network. In the conventional lumped element quarter wave network the inductor L1 (seen in prior art FIG. 1) with a nominal value of +j50 must pass a relatively large circulating current. This results in constraints in quality (Q) factor and RF current handling that typically rule out the use of chip type inductors for this application for radios incorporating transmitters of 1 watt or greater power output. Alternatively, the use of an air wound coil typically tends to cause problems during the manufacturing process.

In the improved wide band circuit shown in FIG. 5, inductor 107 will nominally be a significantly higher reactance than 50 ohms and the circulating current will decrease accordingly. Thus depending on the reactance value chosen, a chip inductor can be used for portable radio power levels. Moreover, thermal dissipation concerns in PIN switching diodes sometimes force the use of expensive ceramic or glass packaged diodes when inexpensive plastic packaged parts would otherwise be satisfactory. The circulating current in inductor 107 and diode 109 of the broad band circuit of FIG. 5 is decreased as the reactance of the inductor 107 is increased.

Although the dissipation in diode 105 is unaffected, the new topology will reduce power dissipation in the diode 109 allowing potential size and cost reduction of the electronic wide band RF switch 100. The new topology also has a favorable impact on transmit to receive isolation. Note that when the switch is biased (as compared with a neutral or unbiased state) into the transmit state inductor 107 and diode 109 form a voltage divider. It should also be noted that as the value of inductor 107 is increased, i.e. as the transmit path bandwidth is increased, the transmit to receive isolation for a given diode internal resistance will also improve.

Figure 6:
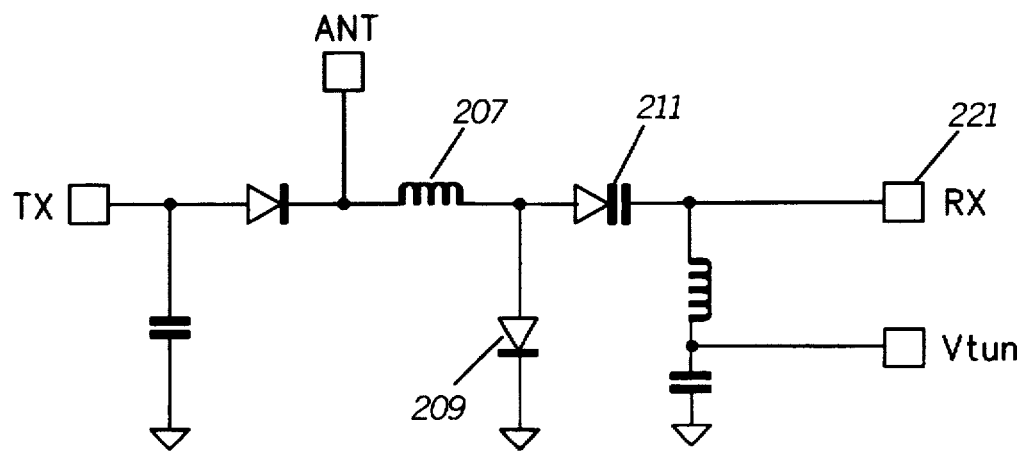
FIG. 6 is a circuit diagram showing a second embodiment of a low loss wide bandwidth radio frequency switch.

In yet another embodiment of the invention, a similar design may be used in very wide band applications. As seen in FIG. 6, an electronic wide band RF switch 200 includes the components as seen in FIG. 5 however a voltage variable capacitor such as a varactor diode 211 is used between the inductor 207 and receiver port 221. In this configuration, the transmit bandwidth may be set as wide as necessary. The limiting factor on the receiver path bandwidth is the choice of the varactor diode 211 and its tuning voltage range. This is most applicable in very wide band designs where the preselector is also voltage tuned. So long as the switch bandwidth is wider than the preselector, the filter tuning voltage can be reused to tune the switch. The varactor diode 211 is protected from high voltage RF when transmitting by the PIN diode 209.

Alternatively the tunable pole formed by inductor 207 and varactor diode 211 can be absorbed into the receiver preselector thus making these elements even lower cost, using less board space and having lower signal loss. The design flexibility afforded by this topology can also be advantageous in some relatively narrow band applications. Radios designed for the 800 MHz SMR band require a transmit pass band of 806 to 870 MHz and a receive band of only 851 to 870 MHz. Although these bandwidth can be covered with a conventional quarter wave type design, the ability to individually center the transmit and receive bands and "over design" the operating bandwidth makes the circuit virtually insensitive to tolerance and parasitic variations resulting in lower worst case loss.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A electronic radio frequency (RF) switch for switching RF energy at a transmit frequency and receive frequency comprising:

an inductor;

a first diode connected between a transmit port and an antenna port;

a first capacitor connected between the transmit port and a ground potential for canceling an inductive susceptance of the inductor at the transmit frequency;

a second capacitor serially connected with the inductor and connected between the antenna port and a receive port for canceling an inductive reactance of the inductor at the receive frequency;

a second diode connected between the inductor and second capacitor and a ground potential; and wherein the antenna port is connected with the receive port via the inductor and second capacitor and the transmit port is isolated from the antenna port via the first diode and further wherein the antenna port may be connected to the transmit port via the first diode and the receive port isolated from the antenna port via the second diode and the inductor when direct current is applied through the transmit port for forward biasing the first and second diodes.

2. A radio frequency (RF) switch as in claim 1 further wherein the second capacitor is electronically varied for tuning the series resonant frequency of an antenna to receive path so as to minimize the loss of the receiver to antenna path using a variable voltage.

3. A radio frequency (RF) switch as in claim 1 wherein the second capacitor is a voltage variable type.

4. An radio frequency (RF) switching circuit for use with a two-way radio transceiver comprising:

a first diode, inductor and first capacitor serially connected between a transmit port and a receive port;

an antenna port connected between the first diode and the inductor;

a second capacitor connected between the transmit port and a ground potential;

a second diode connected between a junction formed by the inductor and first capacitor, and the ground potential; and wherein the first capacitor cancels inductive susceptance of the inductor at a transmit frequency and the second capacitor cancels inductive reactance of the inductor at the receive frequency and further wherein the antenna port is switched between the receive port and the transmit port when a biasing current is applied from the transmit port to the first diode through the inductor and to the second diode.

5. A radio frequency (RF) switching circuit for switching an antenna port between a receive port and a transmit port, in a two-way radio transceiver comprising:

a first diode, inductor and first capacitor serially connected between the transmit port and the receive port;

a second capacitor connected between the transmit port and ground;

a second diode connected between a junction formed by the inductor first capacitor and ground; and wherein the first capacitor cancels inductive susceptance of the inductor at a transmit frequency and the second capacitor cancels inductive reactance of the inductor at the receive frequency and further wherein the inductor and the first capacitor form a series resonant circuit to electrically connect the antenna port to the receive port when the first diode and second diode are in an unbiased state.

6. A radio frequency (RF) switching circuit as in claim 5 wherein the first diode presents a high impedance at radio frequency in its unbiased state for isolating the transmit port from the antenna port.

7. A radio frequency (RF) switching circuit as in claim 5 further wherein a forward biasing current is applied to the first diode and second diode for connecting the antenna port to the transmit port and for connecting a junction of the inductor and first capacitor to ground for isolating the receive port from the antenna port.

8. A radio frequency (RF) switching circuit as in claim 5 further wherein a forward biasing current is applied to the first diode and second diode such that the diodes are biased to a low impedance state connecting the inductor and the second capacitor in parallel forming a parallel inductor-capacitor (L-C) circuit between the transmit port, antenna port and ground.

* * * * *